United States Patent
Hirano

[11] Patent Number: 6,111,785
[45] Date of Patent: Aug. 29, 2000

[54] NONVOLATILE SEMICONDUCTOR MEMORY DEVICE CAPABLE OF DECREASING LAYOUT AREA FOR WRITING DEFECTIVE ADDRESS

[75] Inventor: Yasuaki Hirano, Yamatokooriyama, Japan

[73] Assignee: Sharp Kabushiki Kaisha, Osaka, Japan

[21] Appl. No.: 09/379,009

[22] Filed: Aug. 23, 1999

[30] Foreign Application Priority Data

Aug. 25, 1998 [JP] Japan ................................. 10-238711

[51] Int. Cl.$^7$ .................................................. G11C 16/06
[52] U.S. Cl. ............................... 365/185.09; 365/185.17
[58] Field of Search ......................... 365/185.09, 185.17, 365/226, 200

[56] References Cited

U.S. PATENT DOCUMENTS 5,018,104  5/1991  Urai ........................................ 365/200
5,812,467  9/1998  Pascucci ................................. 365/200
5,930,169  7/1999  Iwata et al. .......................... 365/185.09

FOREIGN PATENT DOCUMENTS 2-307245  12/1990  Japan .
5-276018  10/1993  Japan .
6-150689   5/1994  Japan .

*Primary Examiner*—Huan Hoang
*Attorney, Agent, or Firm*—Morrison & Foerster LLP

[57] ABSTRACT

A latch circuit functions as a write latch circuit when writing a defective address into a nonvolatile semiconductor memory cell array. The latch circuit also functions as a defective address latch circuit when the power voltage rises. Therefore, the layout area of the defective address setting circuit can be reduced as compared with the defective address setting circuit of the conventional flash memory of the FN—FN type provided with a write latch circuit and a defective address latch circuit.

6 Claims, 10 Drawing Sheets

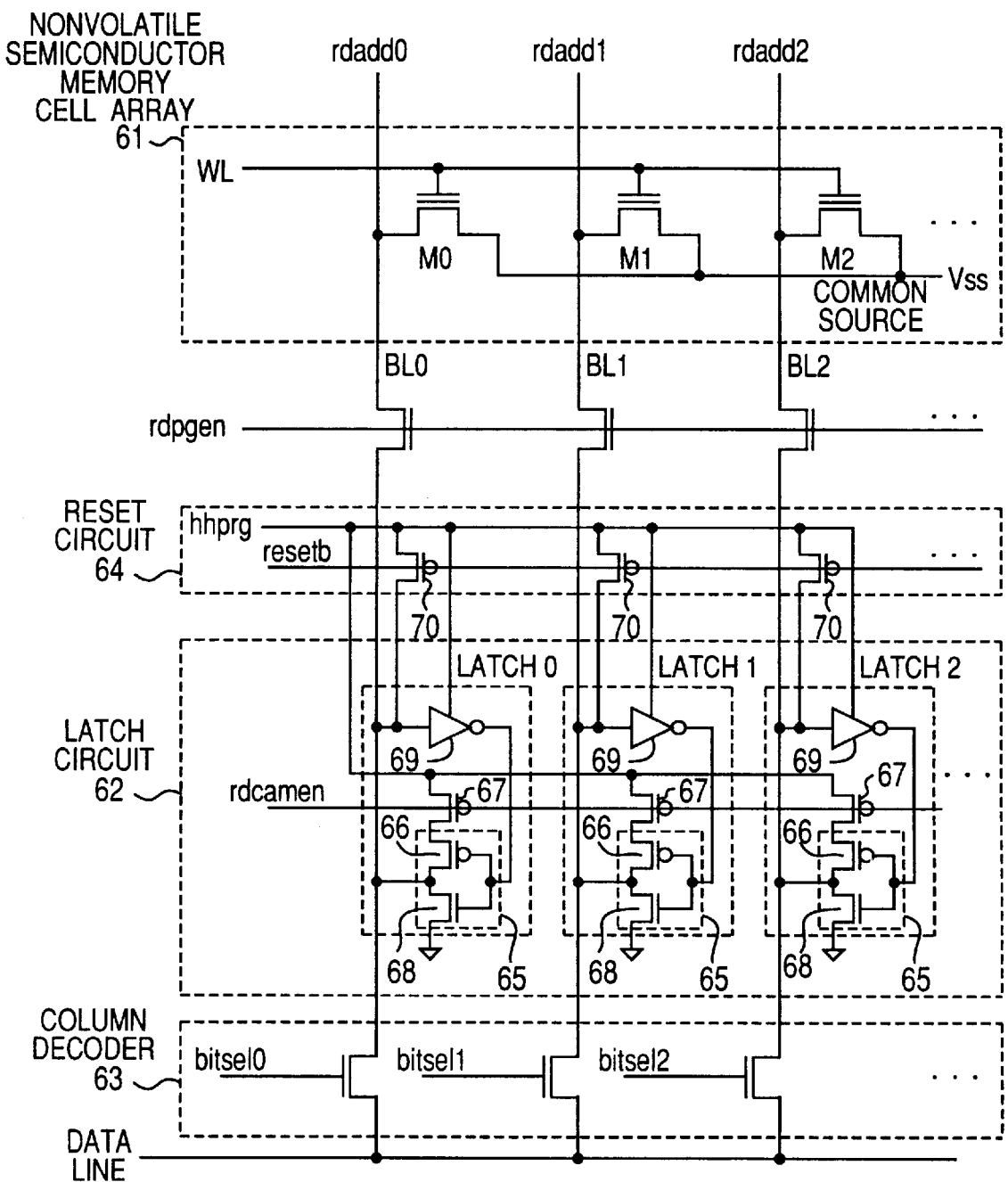

NONVOLATILE SEMICONDUCTOR MEMORY DEVICE CAPABLE OF DECREASING LAYOUT AREA FOR WRITING DEFECTIVE ADDRESS

BACKGROUND OF THE INVENTION

The present invention relates to a nonvolatile semiconductor memory device having a redundancy function.

In order to improve the yield, the nonvolatile semiconductor memory device has a redundancy function for replacing a defective bit line, a defective word line and a defective memory cell with normal ones. The nonvolatile semiconductor memory device having such a redundancy function is required to store the addresses of the defective bit line, defective word line and defective memory cell.

Conventionally, the most general method for storing the addresses of the defective bit line, defective word line and defective memory cell (the addresses being referred to as a defective address hereinafter), there is the one that employs a fuse as disclosed in the prior art references of Japanese Patent Laid-Open Publication Nos. HEI 2-307245 and HEI 6-150689. According to this method, when storing a 3-bit address, as shown in FIG. 8, if the defective address is, for example, "101", then a fusel is cut. The specifying of the defective address and the cutting of the fuse are executed in a device testing stage.

After the completion of the above-mentioned test, the device practically operates as follows. If a power voltage Vcc rises and the level of a signal rdcamen goes high to turn on transistors 1 through 3, then input voltages of inverters 4 and 6 are pulled up to a voltage Vss via a fuse0 and a fuse2. Consequently, the outputs of the inverters 4 and 6, i.e., the levels of address signals rdadd0 and rdadd2 are latched to the high level. On the other hand, the input voltage of an inverter 5 maintains the high level since the fusel is cut. Consequently, the output of the inverter 5, i.e., the level of the address signal rdadd1 is latched to the low level. The defective address "101" is thus set.

In this case, what becomes the most serious problem is the layout area of the portions of the fuse0 through fuse2. In accordance with the progress in density of integration and the increase in number of defective addresses for storage, the fuses are increased in number to increase the layout area of the fuses, and this requires a reduction in layout area of the fuses.

In view of the above, as a method for solving the aforementioned problems, there is the method of employing electrically writable nonvolatile semiconductor memory cells in place of the fuses, as disclosed in the prior art reference of Japanese Patent Laid-Open Publication No. HEI 5-276018. The circuit diagram of one example of the above is shown in FIG. 9. In this defective address setting circuit, electrically writable nonvolatile semiconductor memory cells having a floating gate (referred to simply as memory cells hereinafter) M0 through M2 are arranged in place of the fuse0 through fuse2 in the circuit shown in FIG. 8. This defective address setting circuit is further provided with a column decoder for selectively turning on the illustrated transfer gates by bit selection signals bitse10 through bitse12, a data latching function for writing defective address data and a level shifter.

The following will describe the setting of the defective address "101" with this defective address setting circuit. The defective address setting circuit shown in FIG. 9 is the circuit applied to a flash memory for executing writing with channel hot electrons represented by ETOX (brand name of Intel Corporation). In the flash memory of this type, the threshold value of the memory cell M is about 0.5 V to 1.5 V in the initial state. Writing into this memory cell M is executed with hot electrons as follows.

First, if the level of a data line 11 in FIG. 9 goes high, then low-level write data is latched into a write data latch circuit 12. The word line WL of the memory cell M0 is raised up to Vpp (10 V, for example) and the level of the bit selection signal bitse10 becomes Vpp. In this stage, a transistor 14 has a gate voltage of 0 V since the output level of a level shifter (HV) 13 is latched to the low level, so that the transistor 14 is turned off. Consequently, the bit line BL0 is brought into a floating state and the threshold value of the memory cell M0 is maintained in a low state (1.5 V or lower). Next, if the level of the data line 11 goes low, then the high-level write data is latched into the write data latch circuit 12. The word line WL of the memory cell M1 is raised to Vpp, and the level of the bit selection signal bitse11 becomes Vpp. In this stage, the gate voltage of the transistor 14 becomes Vpp since the output level of the level shifter circuit 13 is latched to the high level, so that the transistor 14 is turned on. Consequently, the voltage of the bit line BL1 becomes hhprg (6 V, for example), and the threshold value of the memory cell M1 increases due to the channel hot electrons. Subsequently, the data line 11 goes low and the word line WL is raised up to Vpp. If the level of the bit selection signal bitse12 becomes Vpp, then the threshold value of the memory cell M2 is maintained in the low state, similarly to the case of the memory cell M0. The specifying of the defective address and the writing into the corresponding memory cell M is executed in the device testing stage.

After the completion of the aforementioned test, the device practically operates as follows. If the power voltage Vcc (3 V, for example) rises, the word line WL rises to Vcc and the level of the signal rdcamen goes high to turn on transistors 15 through 17, then the memory cells M0 and M2 of the low threshold value are turned on to pull the input voltages of inverters 18 and 20 up to Vss. Consequently, the outputs of the inverters 18 and 20, i.e., the address signals rdadd0 and rdadd2 are latched to the high level. On the other hand, the input voltage of an inverter 19 is maintained at the high level since the memory cell M1 of the high threshold value is turned off. Consequently, the output of the inverter 19, i.e., the address signal rdadd1 is latched to the low level. The defective address "101" is thus set.

Thus, the defective address is set and stored in the flash memory of the channel hot electron type. There is another problem of "disturbance" that must be considered to be solved in the case of the flash memory. In this case, particularly the gate disturbance in the writing stage emerges as a problem. Writing conditions in the case where the channel hot electrons are used are as shown in FIG. 10 and the writing speed per cell is about 1 μsec. Therefore, in the case of the system in which sequential writing is executed every cell according to the aforementioned procedure, assuming that, for example, 256 cells undergo the sequential writing, then there is the resulting disturbance time interval of 255 μsec under the most severe conditions. This interval is very short as the disturbance time and assures a sufficient tolerance, and accordingly, there is no problem.

The memory cells employed in the main storage circuit and the redundancy storage circuit are formed in the same style. Therefore, if a flash memory of FN (Fowler-Nordheim)—FN type flash memory is employed in the main storage circuit, differently from the flash memory of the channel hot electron type, then a nonvolatile semiconductor memory cell of the FN—FN type is to be used for the redundancy storage circuit and the nonvolatile semiconductor memory cell array for defective address writing use. Therefore, a defective address setting circuit in the case where the defective address of the flash memory of the FN—FN type is set and stored by the electrically writable nonvolatile semiconductor memory cells is as shown in FIG. 11.

In this case, the reason why the defective address setting circuit as shown in FIG. 9 cannot be used in the case of the flash memory of the FN—FN type is as follows. That is, the flash memory of the FN—FN type has a writing speed of about 1 msec per cell, which is slower than in the flash memory of the channel hot electron type. The disturbance conditions in this case are as shown in FIG. 12. If 256 cells are subjected to the sequential writing, then the disturbance time interval accumulates to 255 msec, which is so long that a change in threshold value is disadvantageously caused when the defective address setting circuit as shown in FIG. 9 is adopted. Therefore, the circuit construction as shown in FIG. 11 is necessary. According to this circuit construction, it is enabled to suppress the occurrence of disturbance since the writing is executed at a time on the corresponding memory cells of the nonvolatile semiconductor memory cell array after executing latching in the write latch circuits corresponding to the pieces of defective address data.

The operation of the defective address setting circuit shown in FIG. 11 will be described below. In this case, the memory cells M0 through M2 are initially brought in a high threshold value state for the erasing. The erasing is executed by applying a voltage Vns (−8 V, for example) to the substrate on which a common source and a memory cell M are formed, bringing each bit line BL in an open state and applying a voltage Vpp (10 V, for example) to the word line WL. The erasing is thus executed by increasing the threshold value to 4 V or higher with electrons injected from the channel region into the floating gate.

Subsequently, the defective address data are written into a nonvolatile semiconductor memory cell array 27 as follows. Initially, the defective address data are transferred to the latches of a write latch circuit 26. First, the level of a data line 21 goes high and the level of the signal bitse10 goes high to turn on the transistor 23 of a column decoder 22, by which the high level is latched in the latch0 of the write latch circuit 26. Subsequently, the level of the data line 21 goes low and the level of the signal bitse11 goes high to turn on a transistor 24, by which the low level is latched in the latch1 of the write latch circuit 26. Subsequently, if the level of the data line 21 goes high similarly, then the level of the bitse12 goes high to turn on a transistor 25, and the high level is latched in the write latch circuit 26.

Subsequently, if the voltage of the word line WL of the nonvolatile semiconductor memory cell array 27 becomes Vnn (−8 V, for example), the voltage of the signal hhprg of the write latch circuit 26 becomes Vpg (5 V, for example) and a signal rdpgen becomes Vpps (7 V, for example), then a voltage of 5 V is applied to the bit lines BL0 and BL2 since the high level is latched in the latch0 and the latch2. By the above operation, a FN tunneling phenomenon occurs on the drain side of the memory cells M0 and M2, so that electrons are drawn to the drain side to reduce the threshold voltage to 1.5 V or lower. In contrast to this, a voltage of 0 V is applied to the bit line BL1 since the low level is latched in the latch1. By the above operation, the threshold voltage of the memory cell M1 is maintained at 4 V or higher.

The defective address setting circuit in which the defective address is thus set operates as follows when practically used as a device. If the power voltage Vcc (3 V, for example) rises, then the voltages of the word line WL of the nonvolatile semiconductor memory cell array 27 and the signal rdcamen rises to the power voltage Vcc. Then, the memory cells M0 and M2 of which the threshold value is reduced to 1.5 V or lower are turned on, while the memory cell M1 of which the threshold value is maintained at 4 V or higher is turned off. Therefore, similar to the case of the fuses of the defective address setting circuit shown in FIG. 8, the input voltages of inverters 29 and 31 of a defective address latch circuit 28 is pulled up to the common source (voltage Vss) via the memory cells M0 and M2. Consequently, the outputs of the inverters 29 and 31, i.e., the levels of the address signals rdadd0 and rdadd2 are latched to the high level. On the other hand, the input voltage of an inverter 30 maintains the high level since the memory cell M1 is in the off state. Consequently, the output of the inverter 30, i.e., the level of the address signal rdadd1 is latched to the low level. The defective address "101" is thus set.

If the defective address is stored in the electrically writable nonvolatile semiconductor memory as described above, then it is enabled to reduce the layout area as compared with the case where the fuses are used.

However, when storing the defective address into the nonvolatile semiconductor memory cell array in the conventional flash memory of the FN—FN type, the defective address setting circuit is constructed of the defective address latch circuit 28, the nonvolatile semiconductor memory cell array 27, the write latch circuit 26 and the column decoder 22. As described above, when using the flash memory of the EN—FN type, the write latch circuit 26 having the latch0 through latch2 must be provided for each memory cell M in relation to the gate disturbance in the writing stage. Accordingly, there is the problem that the layout area is increased by the write latch circuit 26 than in the case of the flash memory of the channel hot electron type.

SUMMARY OF THE INVENTION

Accordingly, the object of the present invention is to provide a nonvolatile semiconductor memory device of the FN—FN type capable of suppressing the increase in layout area to be used for the writing of the defective address.

In order to achieve the object, there is provided a nonvolatile semiconductor memory device having a main storage circuit in which memory cells comprised of floating-gate field-effect transistors capable of executing electrical writing and erasing are arranged in a matrix form, a redundancy storage circuit in which memory cells comprised of floating-gate field-effect transistors capable of executing electrical writing and erasing are arranged in a matrix form and a redundancy function which takes effect, when a defective column line, a defective row line or a defective memory cell exists in the main storage circuit, to replace the defective component with a normal column line, a normal row line or a normal memory cell in the redundancy storage circuit, the device comprising:

a defective address storage circuit which is constructed of memory cells comprised of floating-gate field-effect transistors capable of executing electrical writing and erasing and in which address data of the defective column line, defective row line or defective memory cell is written; and a latch circuit which once latches the inputted address data when the address data is written into the defective address storage circuit and latches the address data that is being written in the defective address storage circuit when a power voltage rises.

According to the above construction, if the defective address data are written into the defective address storage circuit in which memory cells comprised of the floating-gate field-effect transistors capable of executing electrical writing and erasing are arranged, then the inputted address data are once latched in the latch circuit. When the power voltage rises, the address data written in the defective address storage circuit are latched in the latch circuit. Thus, by making the latch circuit function as the so-called write latch circuit and the defective address latch circuit, the conventional write latch circuit is eliminated to reduce the layout area of the defective address setting circuit.

In one embodiment of the present invention, the floating-gate field-effect transistors of the defective address storage circuit are floating-gate field-effect transistors on which writing and erasing are executed taking advantage of the Fowler-Nordheim tunneling phenomenon.

According to the above construction, the write latch circuit, which has been provided in the nonvolatile semiconductor memory device of the FN—FN type that needs the write latch circuit when writing the defective address data into the defective address storage circuit due to the long disturbance time, is eliminated to reduce the layout area of the defective address setting circuit.

In one embodiment of the present invention, the latch circuit is constructed in blocks of two inverters, and the device comprises a reset circuit for resetting the data latched in the latch blocks of the latch circuit.

According to the above construction, the latch circuit is implemented with the simple construction of the blocks of two inverters. Then, the defective address data latched in the latch circuit when writing the defective address data into the defective address storage circuit are reset by the reset circuit. Therefore, when the power voltage rises, the defective address data written in the defective address storage circuit are latched in the latch circuit without any trouble.

One embodiment of the present invention comprises: a power cutoff means for temporarily cutting off supply of power to a p-type transistor constituting one of the two inverters constituting the blocks of the latch circuit.

According to the above construction, after the pre-charging of each column line of the defective address storage circuit in latching the defective address data in the latch circuit when the power voltage rises, the power to the p-type transistor constituting one of the two inverters constituting the blocks of the latch circuit is temporarily cut off by the power cutoff means. By this operation, each column line is fixed to the high level in the floating state. Therefore, even when the electrons in the pre-charged column line cannot be drawn in the turning-on stage due to the low capacity of the floating-gate field-effect transistor constituting the defective address setting circuit, the voltage level of the corresponding column line infallibly goes low as the time elapses. Subsequently, by stopping the operation of the power cutoff means to supply power to the one inverter, the defective address data are infallibly latched in the latch circuit.

In one embodiment of the present invention, the main storage circuit, the redundancy storage circuit and the defective address storage circuit are comprised of a virtual-ground-type memory cell array in which adjacent memory cells commonly use a column line, cells maintained in an erased state with a threshold voltage higher than a specified value are arranged every other one in the memory cell array of the defective address storage circuit, and the device comprises a defective address data writing means for writing the address data into cells other than the cells maintained in the erased state within the memory cell array when writing the address data into the defective address storage circuit.

According to the above construction, by making the latch circuit function as the write latch circuit and the defective address latch circuit in the defective address setting circuit in which the defective address storage circuit is the virtual-ground-type memory cell array, the conventional write latch circuit is eliminated to reduce the layout area of the defective address setting circuit. In this case, the cells in the erased state are arranged every other one in the memory cell array of the defective address storage circuit, and the defective address data are written into the cells other than the cells in the erased state when writing the defective address data by the defective address data writing means. Therefore, the influence of the defective address data written in the cells other than the cells in the erased state of the defective address storage circuit is prevented from being exerted on the adjacent cells where data writing is executed by virtue of the high threshold voltage of the cell where erasing is executed between both the cells where data writing is executed. Thus, the defective address data is correctly written into the defective address setting circuit.

One embodiment of the present invention comprises: a defective address data writing means for collectively writing all the address data latched in the latch circuit when writing the address data into the defective address storage circuit.

According to the above construction, all the address data are collectively written by the defective address data writing means when writing the defective address data into the defective address storage circuit, so that the disturbance time during writing is reduced.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 3 is a circuit diagram of a defective address setting circuit different from that of FIG. 1;

DETAILED DESCRIPTION OF THE PREFERRED EMBODIMENTS

The present invention will be described in detail below on the basis of the illustrated embodiments thereof.
(First Embodiment)

Figure 1:
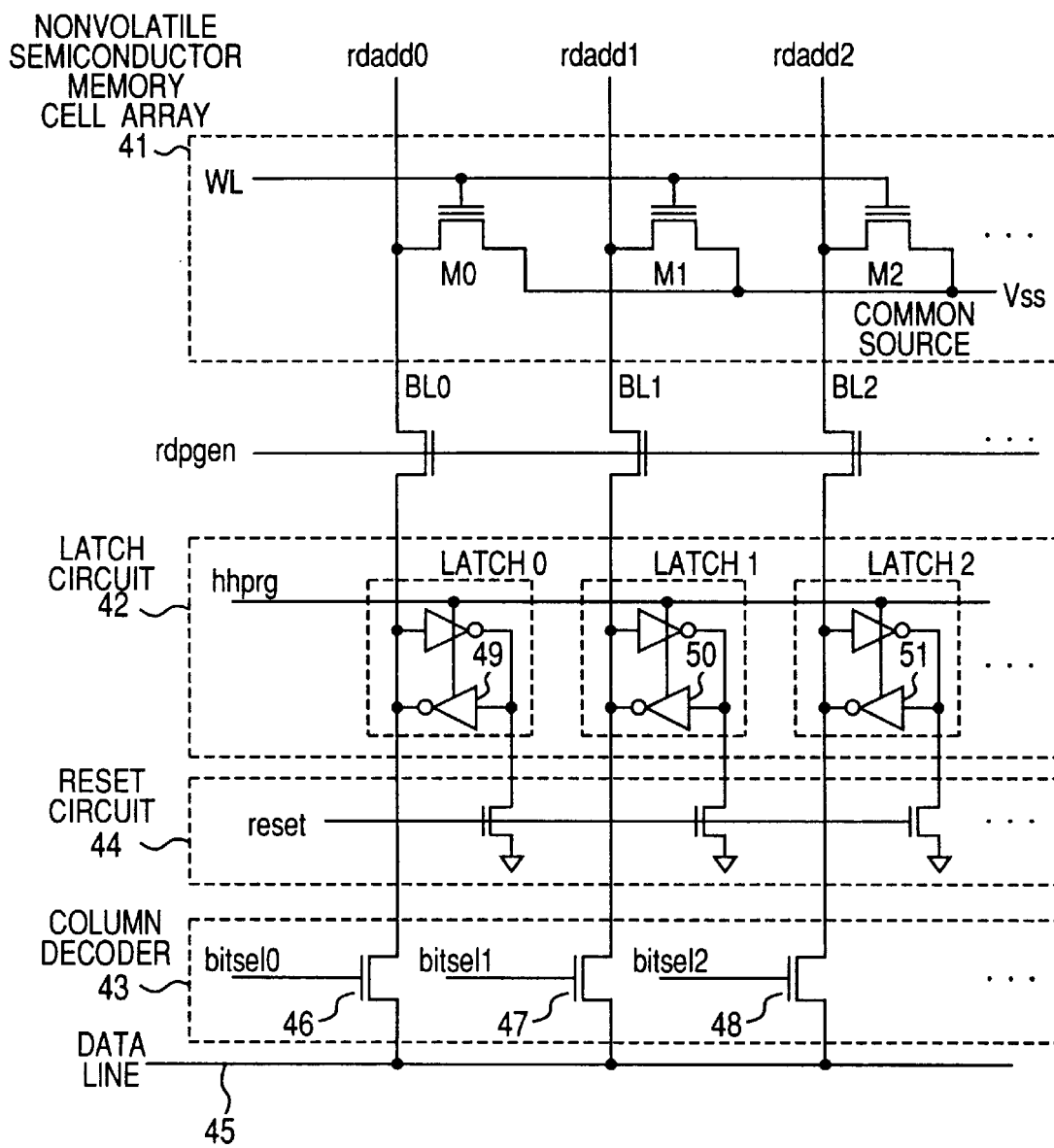
FIG. 1 is a circuit diagram of a defective address setting circuit provided for the nonvolatile semiconductor memory device of the present invention.

FIG. 1 is a circuit diagram of the defective address setting circuit mounted on the nonvolatile semiconductor memory device of the first embodiment. The present defective address setting circuit is constructed roughly of a nonvolatile semiconductor memory cell array 41, a latch circuit 42, a column decoder 43 and a reset circuit 44. It is to be noted that the nonvolatile semiconductor memory device of the present embodiment is the flash memory of the FN—FN type.

Figure 11:
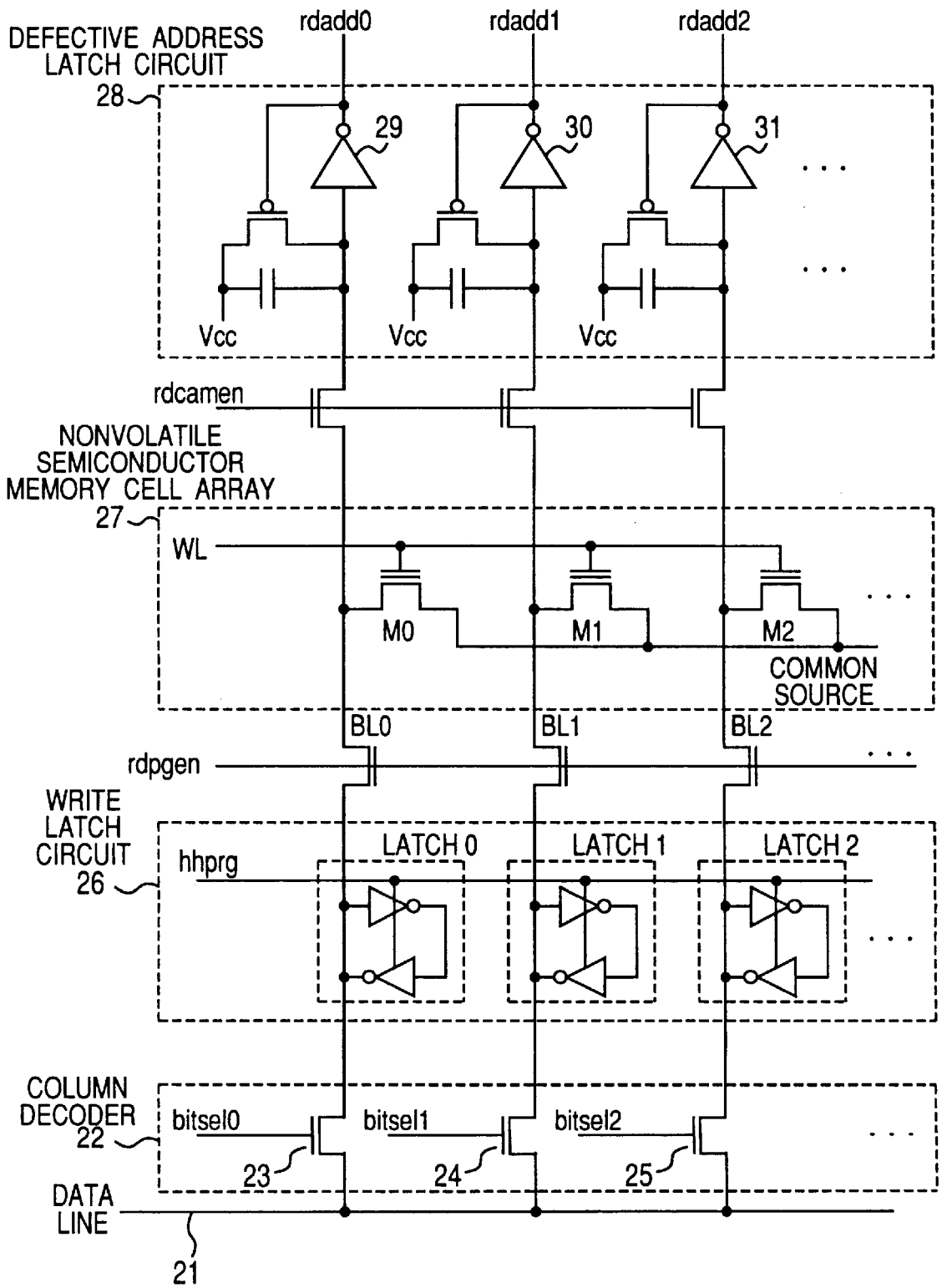
FIG. 11 is a circuit diagram of a prior art defective address setting circuit employing a nonvolatile semiconductor memory cell of the EN—FN type.

The feature of the defective address setting circuit of the present embodiment resides in the point that the function of the write latch circuit and the function of the defective address latch circuit in the defective address setting circuit shown in FIG. 11 are owned by one latch circuit 42. The individual latch units latch0, . . . constituting the latch circuit 42 are provided in correspondence with the individual memory cells M0, . . . constituting the nonvolatile semiconductor memory cell array 41. Further, the individual transistors constituting the reset circuit 44 are provided in correspondence with the individual latch units latch0, . . . constituting the latch circuit 42.

The operation of the defective address setting circuit having the aforementioned construction will be described below. In the present embodiment, the threshold values of the individual memory cells M0, M1, M2, . . . constituting the nonvolatile semiconductor memory cell array 41 are initially at and around 0.5 V, and therefore, the memory cell M is erased so as to set this threshold value at a high state. The erasing method is executed by applying a voltage Vns (−8 V, for example) to the substrate on which the common source and the memory cell M are formed, bringing each bit line BL into an open state and applying a voltage Vpp (10 V, for example) to the word line WL. By thus injecting electrons from the channel layer to the floating gate, the threshold value is increased to 4 V or higher.

Subsequently, the defective address data are written into the nonvolatile semiconductor memory cell array 41 as follows. First, the defective address data are transferred to the latch circuit 42 as follows. That is, the level of a data line 45 goes low, the level of a signal bitse10 goes high to turn on the transistor 46 of the column decoder 43, so that the low level is latched in the latch0 of the latch circuit 42. Next, the level of the data line 45 goes high, the level of the signal bitse11 goes high to turn on the transistor 47, so that the high level is latched in the latch1. Subsequently, the level of the data line 45 goes low and the level of the signal bitse12 goes high to turn on the transistor 48, so that the low level is latched in the latch2.

Subsequently, the voltage of the word line WL of the nonvolatile semiconductor memory cell array 41 becomes Vnn (−8 V, for example), the voltage of the signal hhprg of the latch circuit 42 becomes Vpg (5 V, for example) and the voltage of the signal rdpgen becomes Vpps (7 V, for example). Then, the low level is latched in the latch0 and the latch2 of the latch circuit 42, and therefore, a voltage of 0 V is applied to the bit lines BL0 and BL2. By this operation, the threshold voltages of the memory cells M0 and M2 are maintained at 4 V or higher. On the other hand, the high level is latched in the latch1 of the latch circuit 42, and therefore, a voltage of 5 V is applied to the bit line BL1. By this operation, the FN tunneling phenomenon occurs on the drain side of the memory cell M1, by which the electrons are drawn to the drain side to reduce the threshold voltage to 1.5 V or lower.

Figure 2:
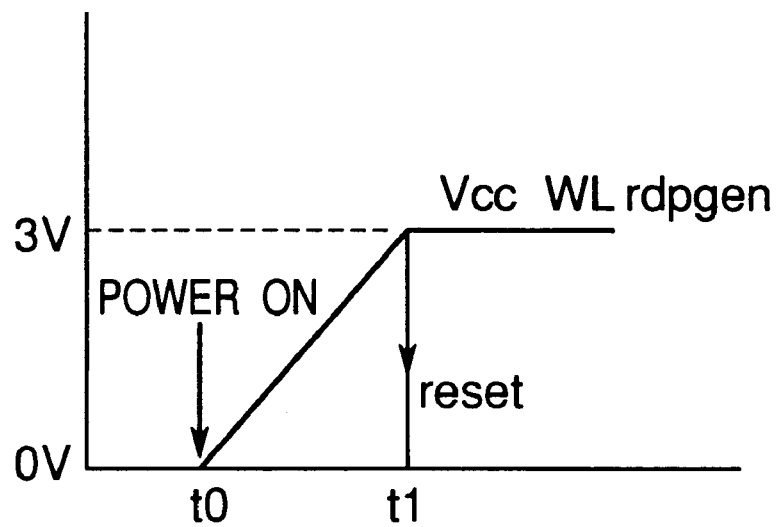
FIG. 2 is a graph showing a change in voltage of each signal at the rise time of a power voltage in the defective address setting circuit shown in FIG. 1.

When the defective address setting circuit that has thus undergone the defective address setting is practically used as a device it operates as follows. A power voltage Vcc raising sequence will be described first. FIG. 2 shows the change in voltage of each signal in the power voltage raising stage. If the power voltage Vcc (3 V, for example) is turned on at a time point t0, then the word line WL of the nonvolatile semiconductor memory cell array 41, the signal rdpgen and the signal reset of the reset circuit 44 rise, so that the power voltage Vcc, word line WL, signal rdpgen and signal reset come to have a voltage of 3 V at a time point t1 . Thus, with the rising voltage of the signal reset to the power voltage Vcc, the input side of the inverters 49 through 51 of the latch0 through latch2 is pulled down to the ground potential, so that the potentials of the bit lines BL0 through BL2 comes to have the high level. Thus, the bit lines BL0 through BL2 are pre-charged. If the pre-charging of the bit lines BL0 through BL2 is completed, then the voltage of the signal reset is set back to the low level (=0 V) at the time point t1.

On the other hand, the voltage of the word line WL in the nonvolatile semiconductor memory cell array 41 has the power voltage Vcc, and therefore, the memory cells M0 and M2 of which the threshold values are maintained at 4 V or higher are turned off. Therefore, the voltages of the bit lines BL0 and BL2 maintain the high level, and this state is latched in the latch0 and the latch2 of the latch circuit 42. Thus, the levels of the address signals rdadd0 and rdadd2 are set to the high level. In contrast to this, the memory cell M1 of which the threshold value is reduced to 1.5 V or lower is turned on. Consequently, the voltage of the bit line BL1 is reduced to the low level and this state is latched in the latch1 of the latch circuit 42. Thus, the level of the address signal rdadd1 is set to the low level. The defective address "101" is thus set.

As described above, in the present embodiment, the defective address setting circuit is constructed of the nonvolatile semiconductor memory cell array 41, the latch circuit 42, the column decoder 43 and the reset circuit 44. Then, the defective address data are latched as voltage levels in the latch0 through latch2 of the latch circuit 42. Then, with the voltage levels latched in the latch0 through latch2 of the latch circuit 42, the threshold voltages of the memory cells M0 through M2 are set to the voltage of not lower than 4 V or not higher than 1.5 V. Thus, the defective address is written into the nonvolatile semiconductor memory cell array 41. By contrast, during the operation of the defective address setting circuit, when the voltage of the word line WL becomes power voltage Vcc, the voltage levels of the bit lines BL0 through BL2 are set according to the threshold voltages of the memory cells M0 through M2 (i.e., according to the defective address data) and these voltage levels are latched in the latch0 through latch2 of the latch circuit 42.

As described above, in the present embodiment, the latch circuit 42 functions as a write latch circuit when writing the defective address into the nonvolatile semiconductor memory cell array 41 and functions as a defective address latch circuit in operation. Therefore, in the nonvolatile semiconductor memory device of the present embodiment, the layout area of the defective address setting circuit can be reduced as compared with the defective address setting circuit of the conventional flash memory of the FN—FN type shown in FIG. 11.

(Second Embodiment)

FIG. 3 is a circuit diagram of the defective address setting circuit of the second embodiment. The present defective address setting circuit is constructed roughly of a nonvolatile semiconductor memory cell array 61, a latch circuit 62, a column decoder 63 and a reset circuit 64. Then, the nonvolatile semiconductor memory cell array 61 and the column decoder 63 have the same constructions and operations as those of the nonvolatile semiconductor memory cell array 41 and the column decoder 43 of the first embodiment.

In the present embodiment, supply of power to the p-MOS (Metal Oxide Semiconductor) transistor 66 constituting one inverter 65 out of two inverters 65 and 69 constituting the latches latch0, . . . of the latch circuit 62 can be turned on and off by a transistor 67. Further, an n-MOS transistor 68 is grounded. Supply of the power voltage to each bit line BL is turned on and off by transistors 70 that constitute the reset circuit 64 and correspond to the latches latch0, . . . of the latch circuit 62.

In the first embodiment, it is sometimes the case where the low level cannot be latched for the reason that the ability of the memory cells M0 and M2 is too low to draw the electrons charged in the bit lines BL0 through BL2 or the reason that the memory cells M0 through M2 do not have enough ability to invert the latches latch0, . . . of the latch circuit 42. The defective address setting circuit of the present embodiment solves the above-mentioned problem of the first embodiment.

The operation of the present defective address setting circuit will be described below. Also, in the present embodiment, the individual memory cells M0, M1, M2, . . . constituting the nonvolatile semiconductor memory cell array 61 are first erased to have a high threshold value. The erasing is executed by making the threshold value of each memory cell M not lower than 4 V, similarly to the first embodiment.

Subsequently, the defective address "101" is transferred to the latches of the latch circuit 62. In this case, the level of the signal rdcamen in the latch circuit 62 is made to go low to connect the p-MOS transistors 66 of the latches to the power source, and a signal resetb in the reset circuit 64 is made to go high to transfer the defective address data similarly to the first embodiment. Consequently, the low level is latched in the latch0 and the latch2, and the high level is latched in the latch1. Next, similarly to the first embodiment, the defective address data are written into the nonvolatile semiconductor memory cell array 61. Consequently, the threshold voltages of the memory cells M0 and M2 are set to 4 V or higher, while the threshold voltage of the memory cell M1 is set to 1.5 V or lower.

Figure 4:
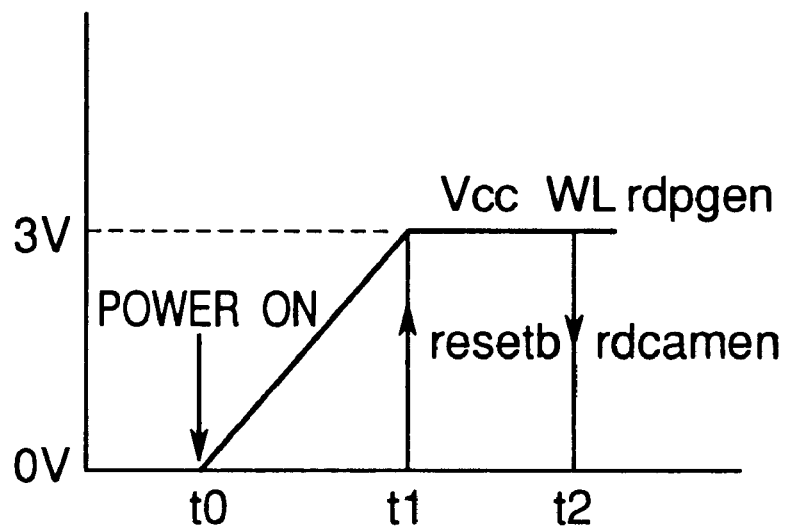
FIG. 4 is a graph showing a change in voltage of each signal at the rise time of a power voltage in the defective address setting circuit shown in FIG. 3.

The defective address setting circuit in which the defective address is thus set operates as follows when practically used. A power voltage Vcc raising sequence will be described first. FIG. 4 shows the change in voltage of each signal in the power voltage raising stage. If the power voltage Vcc is turned on at a time point t0, then the word line WL of the nonvolatile semiconductor memory cell array 61, the signal rdpgen and the signal rdcamen rise, so that the power voltage Vcc, the word line WL, the signal rdpgen and the signal rdcamen come to have a voltage of 3 V at a time point t1. Then the level of all the bit lines BL are pre-charged with the high level since the level of the signal resetb has the low level until this time point. Then, the level of the signal resetb goes high (=3V) at the time point t1. In this stage, no power is supplied to all the bit lines BL since the signal rdcamen has the high level, so that the bit lines BL are fixed to the high level in the floating state.

Therefore, even if the memory cell M1 having a low threshold voltage of not higher than 1.5 V has a small capacity, the voltage level of the bit line BL1 infallibly goes low as the time elapses. The voltage levels of the bit lines BL0 and BL2 connected to the memory cells M0 and M2 having a high threshold voltage of not lower than 4 V are maintained at the high level. Thereafter, the signal rdcamen is made to go low at a time point t2 to completely latch the voltage levels of the bit lines BL1 through BL2 (i.e., the defective address data) in the latch circuit 62. By this operation, the levels of the address signals rdadd0 and rdadd2 are set to the high level and the level of the address signal rdadd1 is set to the low level, so that the defective address "101" is set.

Also, in the present embodiment, the latch circuit 62 functions as a write latch circuit when writing the defective address data into the nonvolatile semiconductor memory cell array 61 and functions as a defective address latch circuit in operation. Therefore, the layout area of the defective address setting circuit can be reduced as compared with the defective address setting circuit of the conventional flash memory of the FN—FN type shown in FIG. 11.

(Third Embodiment)

Figure 5:
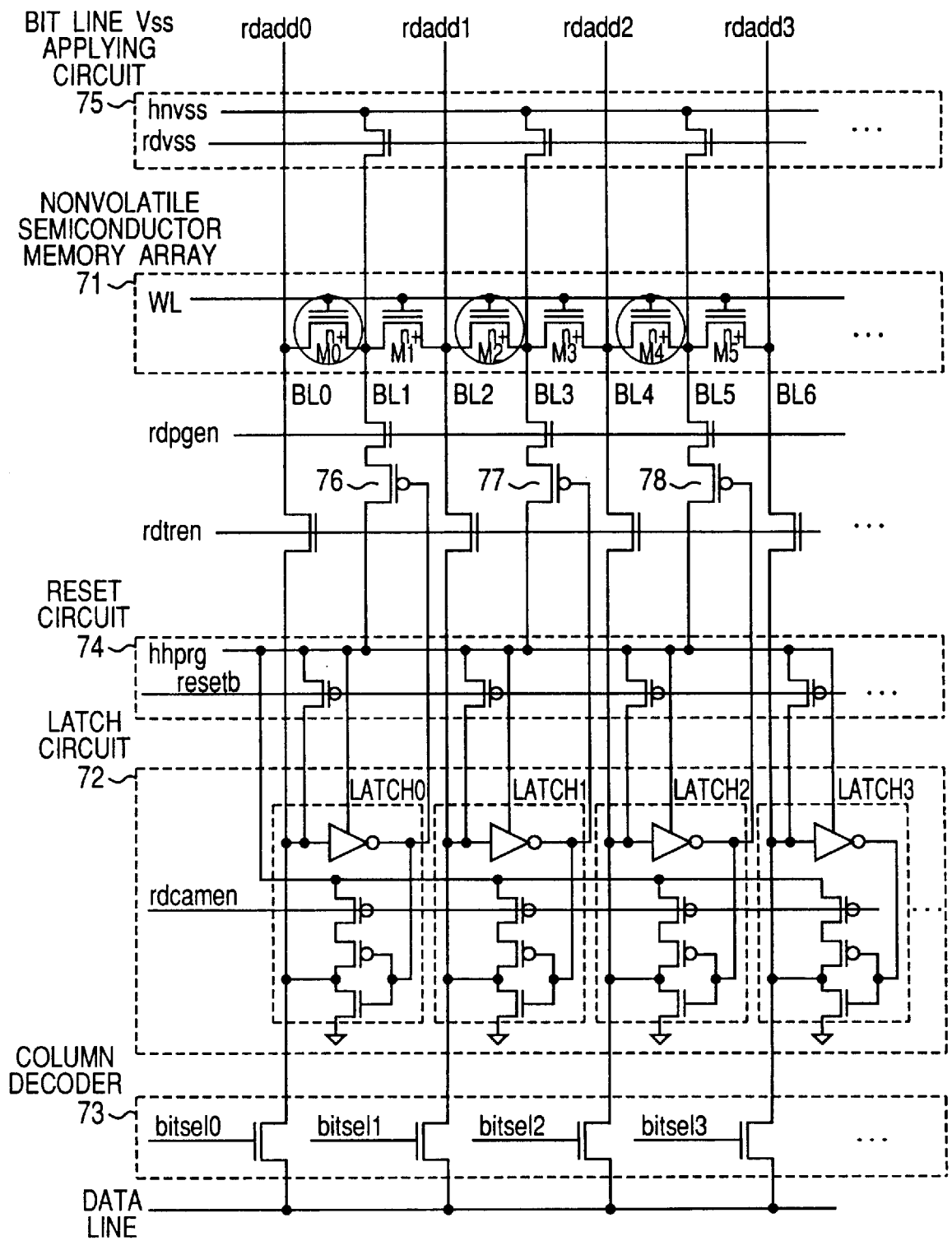
FIG. 5 is a circuit diagram of a defective address setting circuit different from those of FIG. 1 and FIG. 3.

FIG. 5 is a circuit diagram of the defective address setting circuit of the third embodiment. The present defective address setting circuit has a bit line Vss applying circuit 75 in addition to a nonvolatile semiconductor memory cell array 71, a latch circuit 72, a column decoder 73 and a reset circuit 74. Then, the latch circuit 72, the column decoder 73 and the reset circuit 74 have the same constructions and operations as those of the latch circuit 62, the column decoder 63 and the reset circuit 64 of the second embodiment.

The first embodiment and the second embodiment cope with the NOR-type nonvolatile semiconductor memory cell array having a common source. In contrast to this, the present embodiment is an example of a flash memory of the FN—FN type constructed of a virtual-ground-type nonvolatile semiconductor memory cell array. The virtual-ground-type nonvolatile semiconductor memory cell array (referred to simply as a memory cell array hereinafter) 71 is intended for reducing the area of the memory cell array 71 by making common source and the bit lines.

In the virtual-ground-type memory cell array 71, correct defective address latching cannot be achieved since the influence on the adjacent memory cells becomes significant when the threshold values of the peripheral memory cells are low. In view of the above, according to the present embodiment, the memory cells M constituting the memory cell array 71 are alternately erased to provide memory cells M that alternately have a high threshold value. Then, the data of the individual defective addresses are written into the memory cells M that have not been erased. That is, one piece of defective address data is held by two memory cells. In FIG. 5, the defective address data are written into the memory cells M0, M2, M4, . . . encircled by the ○ mark, and the other memory cells M1, M3, M5, . . . are brought in the erased state.

When writing the defective address data into the memory cell array 71, the memory cells M are first erased similarly to the first embodiment. The erasing is achieved by making a signal hnvss of the bit line Vss applying circuit 75 have a voltage Vns (−8 V, for example), making a signal rdvss have the high level, applying the voltage Vns to the substrate on which the memory cells M are formed, bringing the even-number memory cells M0, M2, M4, . . . into the open state and applying a voltage Vpp (10 V, for example) to the word line WL. By this operation, electrons are injected from the channel layer of each memory cell M into the floating gate, by which the threshold value is increased to 4 V or higher.

If the memory cells M are erased, the defective address data are transferred to the latch units latch0, . . . of the latch circuit 72. In this case, the level of the signal rdcamen of the latch circuit 72 is made to go low, and the signal resetb of the reset circuit 74 is made to go high. Thereafter, the defective address data are transferred similarly to the first embodiment. Subsequently, the writing into the memory cell array 71 is executed by supplying the voltages of the levels latched in the latches latch0, of the latch circuit 72 to the bit lines BL1, BL3, BL5, . . . located on the side provided with the "n+" mark in the memory cells M0, M2, M4, . . . encircled by the 0 mark. In this case, assuming that the defective address data is "101", then the low level is latched in the latch0 and the latch2 of the latch circuit 72. Therefore, the transistors 76 and 78 are turned off with the high-level voltage applied to their gates, so that the voltages of the bit lines BL1 and BL5 become 0 V. Consequently, the threshold voltages of the memory cells M0 and M4 are maintained at 4 V or higher. On the other hand, the high level is latched in the latch1. Therefore, a transistor 77 is turned on with the low-level voltage applied to its gate. The level of the signal rdpgen has the high level, and therefore, the voltage of the bit line BL3 becomes the voltage (5V) of the signal hhprg. Consequently, the FN tunneling phenomenon occurs on the drain side of the memory cell M2, so that electrons are drawn toward the drain side to reduce the threshold voltage to 1.5 V or lower.

Figure 6:
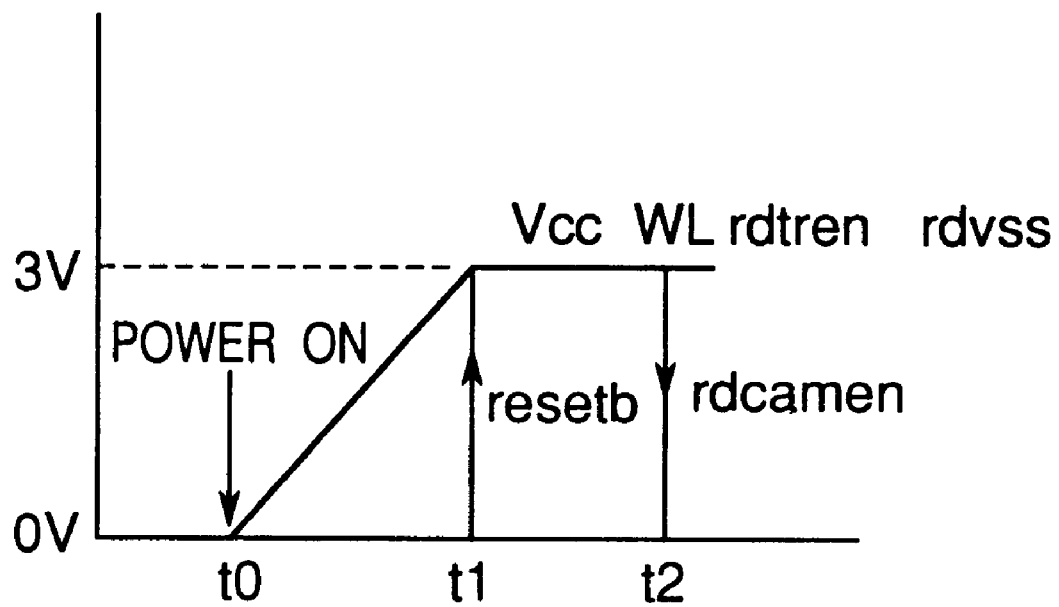
FIG. 6 is a graph showing a change in voltage of each signal at the rise time of a power voltage in the defective address setting circuit shown in FIG. 5.

FIG. 6 shows the change in voltage of each signal in the power voltage raising stage in the case where the defective address setting circuit in which the defective address data is thus set is practically used as a device. The power voltage raising sequence of the present embodiment is basically the same as the power voltage raising sequence as that of the second embodiment. It is to be noted that the present embodiment has no common source since the virtual-ground-type memory cell array 71 is employed. If the power voltage Vcc is turned on at a time point t0, then the signal rdvss rises in addition to the word line WL, a signal rdtren and the signal rdcamen, thereby making the bit lines BL1, BL3, BL5, . . . have a voltage of 3 V at a time point t1. Consequently, the memory cells M0 and M4 having a low threshold value are turned on to set the address signals rdadd0 and rdadd2 to the high level. On the other hand, the memory cell M2 having a high threshold voltage is turned off to set the address signal rdadd1 to the low level. The defective address "101" is thus set and latched in the latch circuit 72.

Also, in the present embodiment, the latch circuit 72 functions as a write latch circuit when writing the defective address into the virtual-ground-type nonvolatile semiconductor memory cell array 71 and functions as a defective address latch circuit in operation. Therefore, the layout area of the defective address setting circuit can be reduced as compared with the defective address setting circuit of the conventional flash memory of the FN—FN type shown in FIG. 11.

(Fourth Embodiment)

Figure 7:
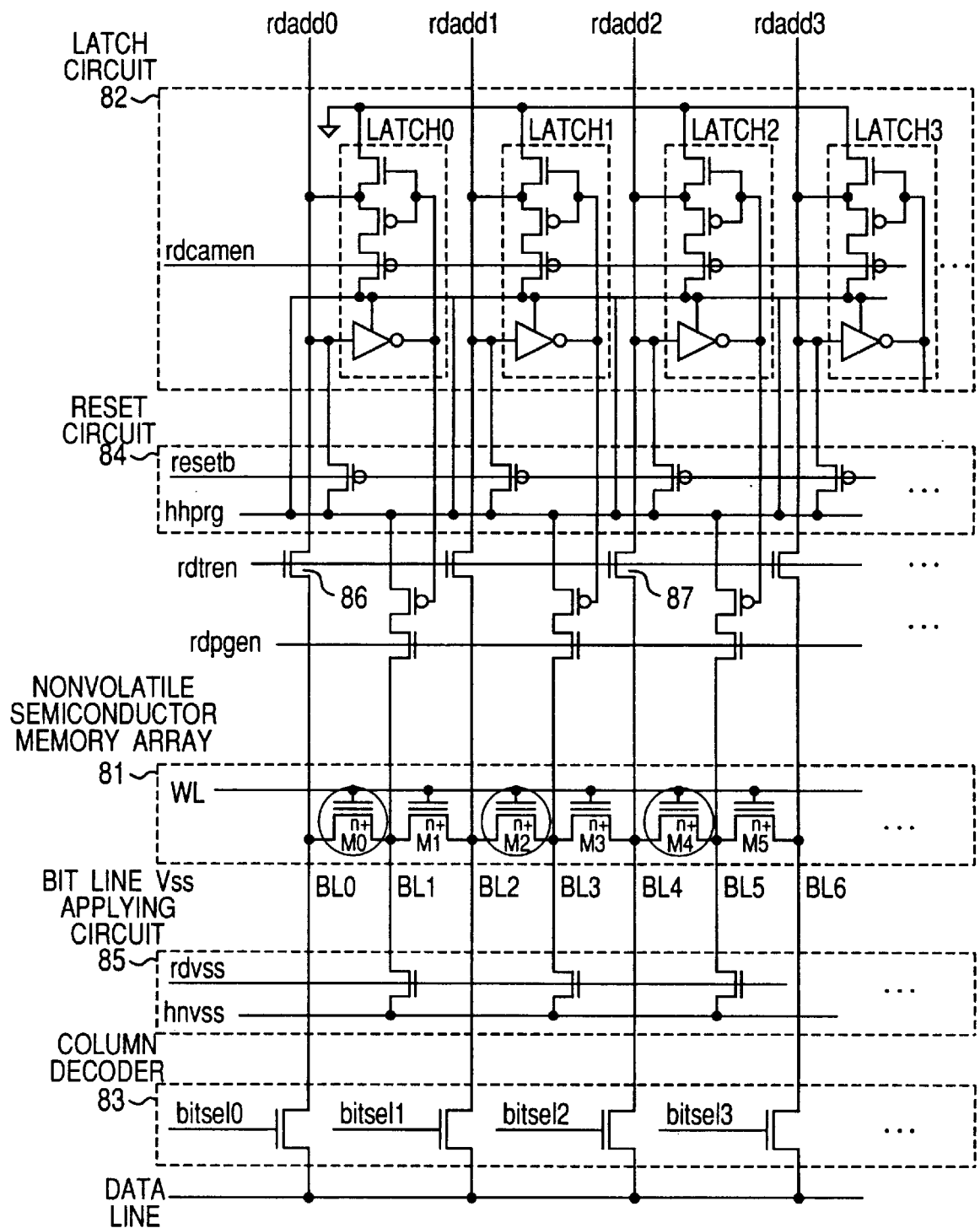
FIG. 7 is a circuit diagram of a defective address setting circuit different from those of FIG. 1, FIG. 3 and FIG. 5.
Figure 8:
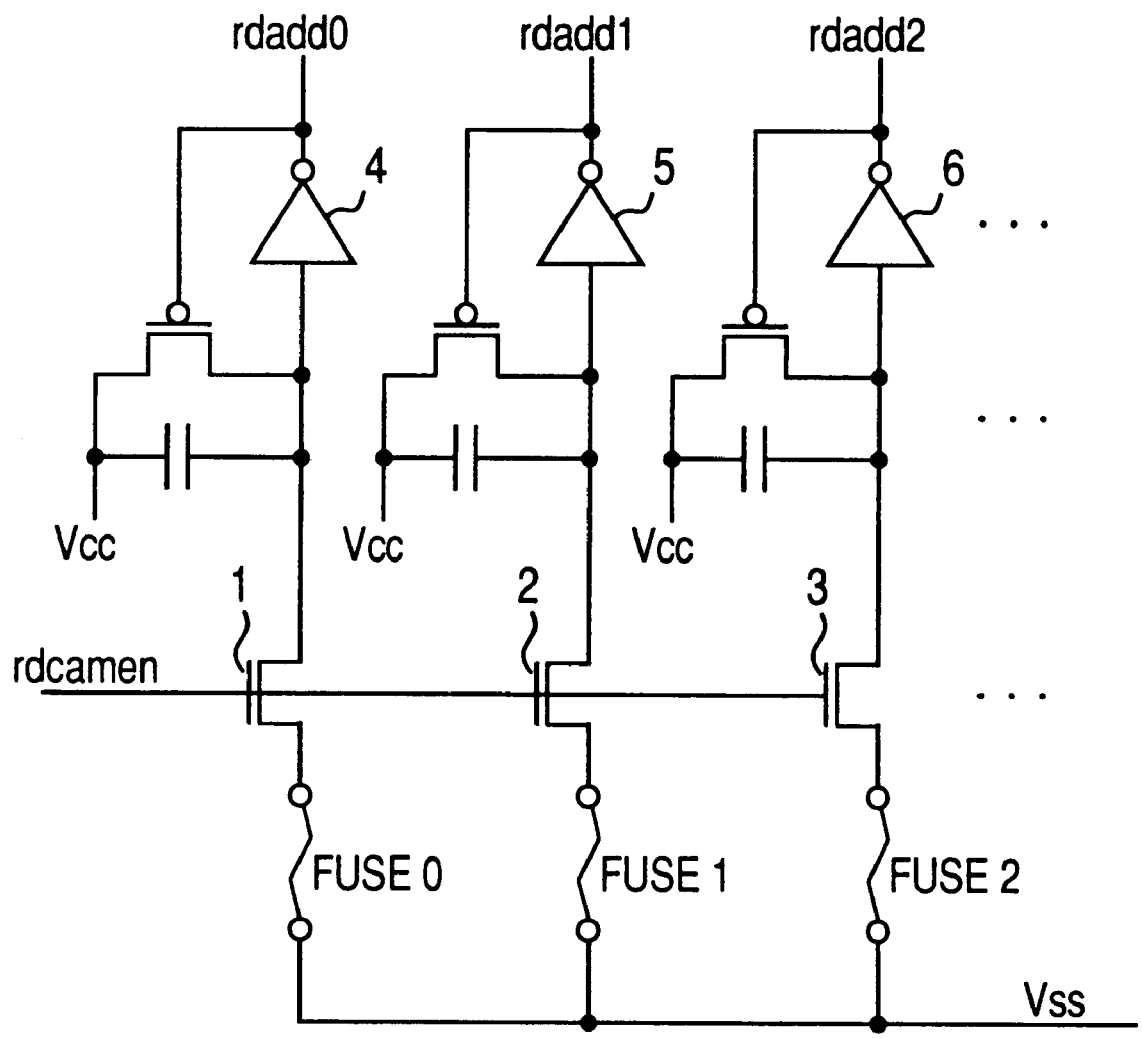
FIG. 8 is a circuit diagram of a prior art defective address setting circuit employing fuses.
Figure 9:
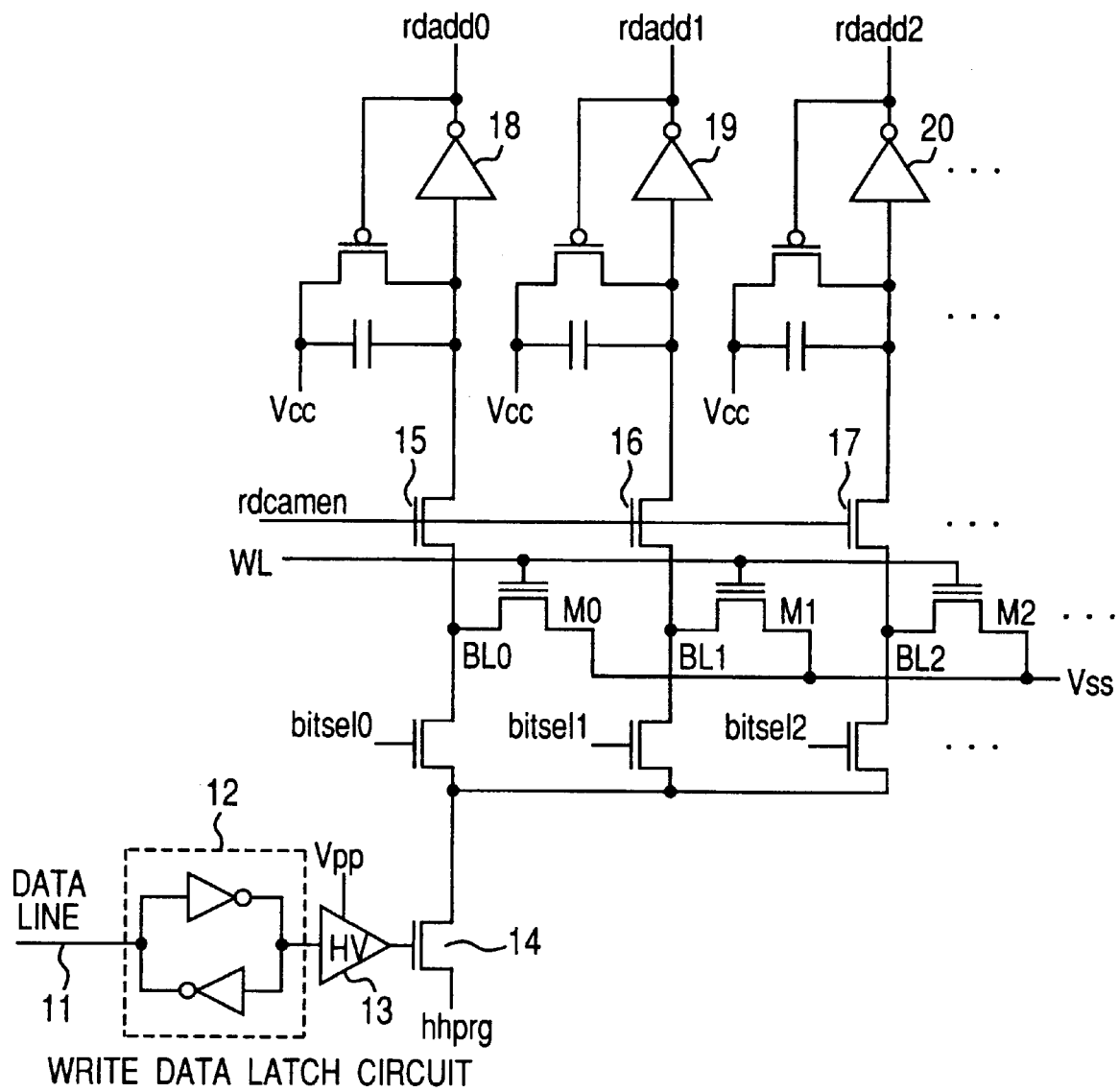
FIG. 9 is a circuit diagram of a prior art defective address setting circuit employing a nonvolatile semiconductor memory cell of the channel hot electron type.
Figure 10:
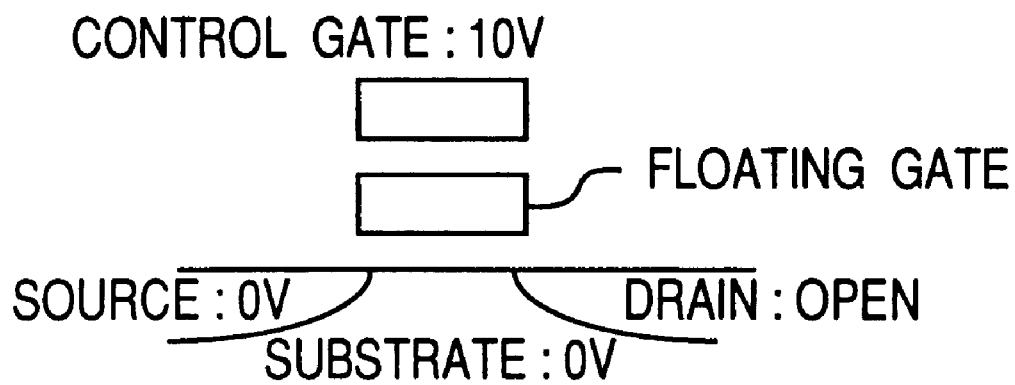
FIG. 10 is a view showing the writing conditions of the nonvolatile semiconductor memory cell of the channel hot electron type.
Figure 12:
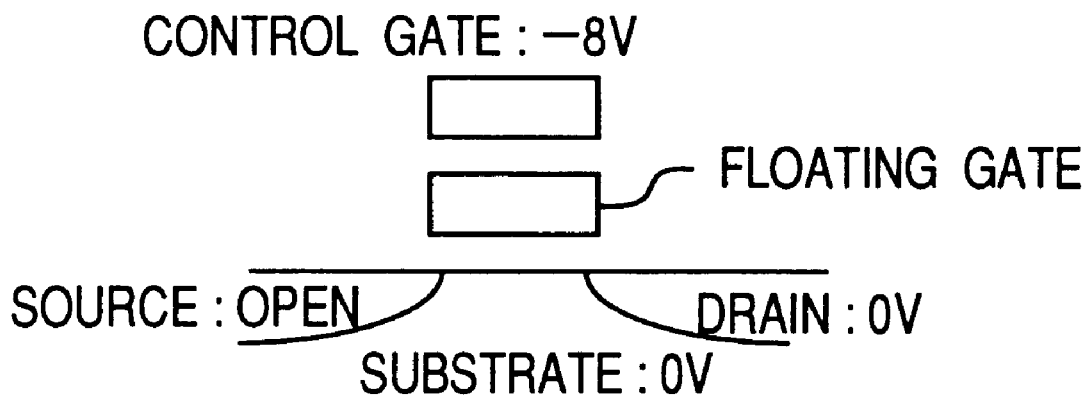
FIG. 12 is a view showing the writing conditions of the nonvolatile semiconductor memory cell of the FN—FN type.

FIG. 7 is a circuit diagram of the defective address setting circuit of the fourth embodiment. The defective address setting circuit of the present embodiment is a defective address setting circuit of the flash memory of the FN—FN type constructed of a virtual-ground-type nonvolatile semiconductor memory cell array, similar to the third embodiment. The present defective address setting circuit has a virtual-ground-type nonvolatile semiconductor memory cell array (referred to simply as a memory cell array hereinafter) 81, a latch circuit 82, a column decoder 83, a reset circuit 84 and a bit line Vss applying circuit 85.

In the third embodiment, the defective address data (i.e., the voltage levels of the bit lines BL0, BL2 and BL4) latched in the latch circuit 72 are outputted as the address signals rdadd0 through rdadd2 via the n-MOS transistor that has a threshold voltage Vth and uses the signal rdtren as a gate signal. Therefore, the high-level voltage of the address signals rdadd0 through rdadd2 becomes (3 V−Vth) obtained by subtracting the threshold voltage Vth from the voltage of 3 V of the signal rdtren of the n-MOS transistor. Therefore, if the outputted address signals rdadd0 through rdadd2 are received by an inverter (not shown), then the p-MOS transistor (normally having a threshold voltage of−3 V) constituting this inverter cannot completely be turned off, causing a direct current path. This might consequently cause a large consumption of power in the inverter portion.

As a method for solving the above disadvantage, it can be considered to make the signal rdtren have a highlevel voltage of not lower than 5 V. However, it is not easy to make the signal rdtren have a voltage of not lower than 5 V in the setup stage. Therefore, the present embodiment solves the aforementioned problem by rearranging the positions of the memory cell array 71, latch circuit 72, column decoder 73, reset circuit 74 and bit line Vss applying circuit 75 of the third embodiment.

That is, in the third embodiment, the latch circuit 72 and the reset circuit 74 are arranged on the column decoder 73 side (on the lower side in FIG. 5) of the memory cell array 71. Therefore, the defective address data latched in the latch circuit 72 is outputted as the address signals rdadd0 through rdadd2 through the n-MOS transistors provided between the reset circuit 74 and the memory cell array 71 as a matter of course. By contrast, in the present embodiment, the latch circuit 82 and the reset circuit 84 are arranged on the opposite side (on the upper side in FIG. 7) of the column decoder 83 with respect to the memory cell array 81. Therefore, the defective address data latched in the latch circuit 82 are outputted as the address signals rdadd0 through rdadd2 without passing through the n-MOS transistors provided between the reset circuit 84 and the memory cell array 81.

As described above, the memory cell array 81, latch circuit 82, column decoder 83, reset circuit 84 and bit line Vss applying circuit 85 of the defective address setting circuit of the present embodiment have quite the same constructions as those of the memory cell array 71, latch circuit 72, column decoder 73, reset circuit 74 and bit line Vss applying circuit 75 of the third embodiment, although the arrangement is different. Therefore, the transfer operation of the defective address data to the latch circuit 82 and the write operation into the memory cell array 81 by the defective address setting circuit of the present embodiment are the same as the transfer operation and the write operation of the third embodiment. The defective address latching sequence in the power voltage raising stage of the present embodiment is the same as the defective address latching sequence of the third embodiment shown in FIG. 6.

Also, in the present embodiment, a voltage (3 V Vth) is supplied through the n-MOS transistors 86 and 87 on the bit lines BL0 and BL4 to the latch0 and the latch2 in the latch circuit 82 for latching the high level at the time of defective address latching in the power voltage raising stage. However, the latch0 and the latch2 latch the voltage of 3 V (=hhprg) on the basis of the high-level signal of (3 V−Vth) and the signal rdcamen of the low level. Therefore, in the case of the present embodiment, the 3-V high-level signals can be outputted as the address signals rdadd0 and rdadd2.

Also, needless to say, in the present embodiment, the latch circuit 82 functions as a write latch circuit when writing the defective address data into the virtual-ground-type nonvolatile semiconductor memory cell array 81 and functions as a defective address latch circuit in operation. Therefore, the layout area of the defective address setting circuit can be reduced as compared with the defective address setting circuit of the conventional flash memory of the FN—FN type shown in FIG. 11.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A nonvolatile semiconductor memory device having a main storage circuit in which memory cells comprised of floating-gate field-effect transistors capable of executing electrical writing and erasing are arranged in a matrix form, a redundancy storage circuit in which memory cells comprised of floating-gate field-effect transistors capable of executing electrical writing and erasing are arranged in a matrix form and a redundancy function which takes effect, when a defective column line, a defective row line or a defective memory cell exists in the main storage circuit, to replace the defective component with a normal column line, a normal row line or a normal memory cell in the redundancy storage circuit, the device comprising:

a defective address storage circuit which is constructed of memory cells comprised of floating-gate field-effect transistors capable of executing electrical writing and erasing and in which address data of the defective column line, defective row line or defective memory cell is written; and a latch circuit which once latches the inputted address data when the address data is written into the defective address storage circuit and latches the address data that is being written in the defective address storage circuit when a power voltage rises.

2. A nonvolatile semiconductor memory device as claimed in claim 1, wherein the floating-gate field-effect transistors of the defective address storage circuit are floating-gate field-effect transistors on which writing and erasing are executed taking advantage of the Fowler-Nordheim tunneling phenomenon.

3. A nonvolatile semiconductor memory device as claimed in claim 1, wherein the latch circuit is constructed in blocks of two inverters, and the device comprises a reset circuit for resetting the data latched in the latch blocks of the latch circuit.

4. A nonvolatile semiconductor memory device as claimed in claim 3, comprising:

a power cutoff means for temporarily cutting off supply of power to a p-type transistor constituting one of the two inverters constituting the blocks of the latch circuit.

5. A nonvolatile semiconductor memory device as claimed in claim 1, wherein the main storage circuit, the redundancy storage circuit and the defective address storage circuit are comprised of a virtual-ground-type memory cell array in which adjacent memory cells commonly use a column line, cells maintained in an erased state with a threshold voltage higher than a specified value are arranged every other one in the memory cell array of the defective address storage circuit, and the device comprises a defective address data writing means for writing the address data into cells other than the cells maintained in the erased state within the memory cell array when writing the address data into the defective address storage circuit.

6. A nonvolatile semiconductor memory device as claimed in claim 1, comprising:

a defective address data writing means for collectively writing all the address data latched in the latch circuit when writing the address data into the defective address storage circuit.

* * * * *